(12) United States Patent
Zhang et al.

(10) Patent No.: US 11,139,349 B2
(45) Date of Patent: Oct. 5, 2021

(54) DISPLAY APPARATUS, PANEL SWITCHING METHOD AND ELECTRONIC DEVICE

(71) Applicant: MOBVOI INFORMATION TECHNOLOGY COMPANY LIMITED, Beijing (CN)

(72) Inventors: Shihai Zhang, Beijing (CN); Yu Zhou, Beijing (CN); Tieshan Chen, Beijing (CN); Xiaoli Shi, Beijing (CN)

(73) Assignee: MOBVOI INFORMATION TECHNOLOGY COMPANY LIMITED ( * ) Notice: Subject to any disclaimer, the term of this patent is extended or adjusted under 35 U.S.C. 154(b) by 782 days.

(21) Appl. No.: 15/778,964

(22) PCT Filed: Feb. 13, 2018

(86) PCT No.: PCT/CN2018/076726
§ 371 (c)(1),
(2) Date: May 24, 2018

(87) PCT Pub. No.: WO2019/056698
PCT Pub. Date: Mar. 28, 2019

(65) Prior Publication Data
US 2021/0202618 A1 Jul. 1, 2021

(30) Foreign Application Priority Data
Sep. 22, 2017 (CN) .......................... 201710867261.7

(51) Int. Cl.
G09G 3/32 (2016.01)
H01L 27/32 (2006.01)
(Continued)

(52) U.S. Cl.
CPC .... *H01L 27/3232* (2013.01); *G02F 1/133528* (2013.01); *G02F 1/133603* (2013.01);
(Continued)

(58) Field of Classification Search
CPC . H01L 27/3232; H01L 27/1225; H01L 27/32; H01L 27/3262; H01L 29/78;
(Continued)

(56) References Cited

U.S. PATENT DOCUMENTS

| 2006/0050214 A1* | 3/2006 | Hong | G02B 5/3016 349/117 |
| 2007/0032000 A1* | 2/2007 | Yeh | G09G 3/3648 438/149 |

(Continued)

FOREIGN PATENT DOCUMENTS

| CN | 1901003 A | 1/2007 |
| CN | 101806962 A | 8/2010 |

(Continued)

OTHER PUBLICATIONS

International Search Report dated Jun. 25, 2018; International Patent Application No. PCT/CN2018/076726 filed Feb. 13, 2018. ISA/CN.

(Continued)

*Primary Examiner* — Pegeman Karimi
(74) *Attorney, Agent, or Firm* — McDonald Hopkins LLC

(57) ABSTRACT

The present disclosure discloses a display apparatus, a panel switching method and an electronic device. The display apparatus includes an organic light-emitting display panel and a liquid crystal display panel disposed on a light-emitting side of the organic light-emitting display panel. The liquid crystal display panel is attached to a metal layer in the organic light-emitting display panel so as to use the metal layer as a backlight source of the liquid crystal display panel.

20 Claims, 6 Drawing Sheets

(51) Int. Cl.
*G02F 1/1335* (2006.01)
*G02F 1/13357* (2006.01)
*G09G 3/3225* (2016.01)
*G09G 3/36* (2006.01)

(52) U.S. Cl.
CPC ......... *G09G 3/3225* (2013.01); *G09G 3/3648* (2013.01); *G09G 2320/0626* (2013.01); *G09G 2354/00* (2013.01)

(58) Field of Classification Search
CPC ........... H01L 29/78696; H01L 29/7869; G02F 1/133603; G02F 1/133528; G09G 3/3225; G09G 3/3648; G09G 3/36; G09G 2320/0626; G09G 2354/00; G09G 3/30; G09G 3/32; G09G 3/34; G09G 3/3258; G09G 3/3266; G09G 3/3291; G09G 2320/02; G09G 2300/0443
See application file for complete search history.

(56) References Cited

U.S. PATENT DOCUMENTS

| | | | |
|---|---|---|---|
| 2011/0050545 | A1 | 3/2011 | Namm et al. |
| 2011/0292095 | A1* | 12/2011 | Yoshida ............ G02F 1/136286 345/690 |
| 2013/0082246 | A1* | 4/2013 | Hasegawa ............. H01L 51/504 257/40 |
| 2016/0043149 | A1* | 2/2016 | Sagardoyburu ..... H01L 27/3232 349/96 |
| 2017/0186990 | A1* | 6/2017 | Nakamura .......... H01L 51/5092 |
| 2018/0375027 | A1* | 12/2018 | Zhang ................. H01L 51/0011 |

FOREIGN PATENT DOCUMENTS

| | | |
|---|---|---|
| CN | 104020602 A | 9/2014 |
| CN | 106324877 A | 1/2017 |
| CN | 106842731 A | 6/2017 |
| CN | 107515492 A | 12/2017 |
| JP | 2003098983 A | 4/2003 |

OTHER PUBLICATIONS

"The Classification of Liquid Crystal Displays".
European Extended Search Report dated Apr. 23, 2021; European Patent Application No. 18723658.3.

* cited by examiner

DISPLAY APPARATUS, PANEL SWITCHING METHOD AND ELECTRONIC DEVICE

CROSS-REFERENCE TO RELATED APPLICATION

This application is a 35 U.S.C. 371 national stage filing of PCT Application No. PCT/CN2018/076726 filed on Feb. 13, 2018, which claims priority to Chinese Patent Application No. 201710867261.7 filed on Sep. 22, 2017, each of which are incorporated herein in their entirety by reference.

TECHNICAL FIELD

The embodiments relate to the display technical field, and for example, relate to a display apparatus, a panel switching method and an electronic device.

BACKGROUND

A twisted nematic (TN) panel becomes a most widely used entry-level liquid crystal panel for low production cost, and is widely used in mainstream medium-end and low-end liquid crystal displays on the market.

An organic light-emitting diode (OLED) is also called as an organic electroluminescence display (OED). The OLED has been widely used in Moving Picture Experts Group Audio Layer-3 (MP3) players since 2003 for the characteristics of light weight, power saving and the like. However, for digital camera (DC) and mobile phones which also belong to digital products, engineering prototypes of which adopting OLED panels were only shown in some exhibition and have not entered a practical application stage.

The inventor find in a research process that a related art has the following defects: contents are displayed on screens of intelligent terminals in the related art generally by using liquid crystal panels or OLED, and different display needs under different scenarios cannot be realized according to user's needs.

SUMMARY

The embodiment provides a display apparatus, a panel switching method and an electronic device capable of realizing different display needs in different application scenarios on a premise that the organic light-emitting display panel and the liquid crystal display panel which are of different types and are stacked vertically are not affected by each other.

In a first aspect, an embodiment provides a display apparatus. The display apparatus includes an organic light-emitting display panel and a liquid crystal display panel disposed on a light-emitting side of the organic light-emitting display panel.

The liquid crystal display panel is attached to a metal layer in the organic light-emitting display panel so as to use the metal layer as a backlight source of the liquid crystal display panel.

Optionally, the organic light-emitting display panel includes:
 a first substrate; and
 organic light-emitting structures at one side of the first substrate and arranged in an array,
 each of the organic light-emitting structures comprises: a hole transporting layer, an organic light-emitting layer, an electron transporting layer and the metal layer which are arranged successively.

Optionally, the organic light-emitting display panel is an active-matrix organic light-emitting diode (AMOLED) panel.

Optionally, the liquid crystal display panel includes: a second substrate, a liquid crystal layer and a third substrate which are arranged successively.

The second substrate is attached to the metal layer in the organic light-emitting display panel. The first substrate and the third substrate are made from transparent materials Optionally, the organic light-emitting structures include a red organic light-emitting structure, a green organic light-emitting structure and a blue organic light-emitting structure. The red organic light-emitting structure is configured to emit red light, the green organic light-emitting structure is configured to emit green light, and the blue organic light-emitting structure is configured to emit blue light.

Optionally, the liquid crystal display panel is film compensation super twisted nematic (FSTN) display panel.

Optionally, the second substrate includes a lower polarizer, and the third substrate includes an upper polarizer and a compensation film located at one side of the upper polarizer facing away from the lower polarizer. The compensation film is configured to improve color shift and realize black-white display.

In a second aspect, the present embodiment also provides a panel switching method, used to conduct switching control over the display apparatus provided in any of embodiments of the present disclosure. The method includes:
 turning on the liquid crystal display panel and turning off the organic light-emitting panel when a first panel use condition is satisfied, so as to use the liquid crystal display panel as a current display panel; and turning on the organic light-emitting panel and turning off the liquid crystal display panel when a second panel use condition is satisfied, so as to use the organic light-emitting panel as a current display panel.

Optionally, the first panel use condition includes any of the following conditions:
 detecting that a user-inputted operation instruction chooses to use a first panel; detecting that an intelligent terminal is in a moving mode or charging mode; detecting that a light intensity is not lower than a preset intensity threshold; and detecting that a length of a time period in which the intelligent terminal is in a standby state is greater than a preset time threshold.

The second panel use condition includes any of the following conditions:
 detecting that an user-inputted operation instruction chooses to use a second panel, and detecting that a complexity of a user triggered event is greater than a preset complexity threshold.

In a third aspect, the present embodiment also provides an electronic device, including the display apparatus in any embodiment.

The technical solution of the present disclosure can realize time-sharing display in different application scenarios on a premise that the organic light-emitting display panel and the liquid crystal display panel which are of different types and are stacked vertically are not affected by each other.

DETAILED DESCRIPTION

The present disclosure is further described in detail below in combination with drawings and embodiments. It can be understood that specific embodiments described herein are only used to explain the present disclosure, not to limit the present invention. It should also be noted that for ease of description, the drawings only show parts related to the present disclosure, not all of structures.

Embodiment 1

Figure 1:
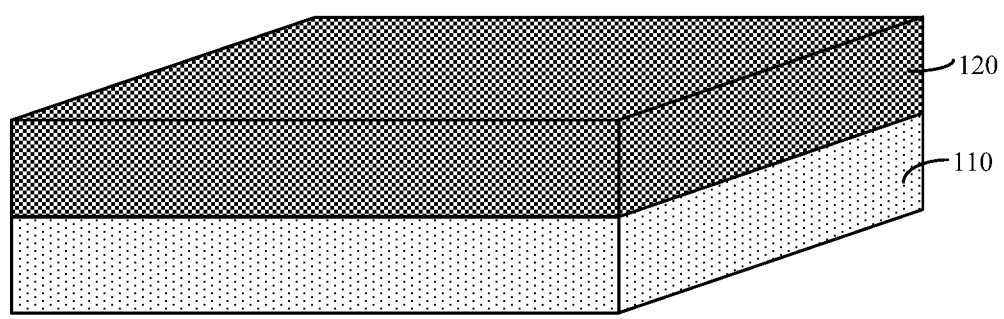
FIG. 1 is a structural schematic diagram illustrating a display apparatus provided in the embodiment 1 of the present disclosure.

FIG. 1 is a structural schematic diagram illustrating a display apparatus provided in the present embodiment 1. The display apparatus includes an organic light-emitting display panel 110 and a liquid crystal display panel 120 disposed on the organic light-emitting display panel 110.

In order to ensure that the organic light-emitting display panel 110 and the liquid crystal display panel 120 do not interfere with each other during time-sharing display, the liquid crystal display panel 120 may be a transparent panel and does not include a backlight source since the organic light-emitting display panel 110 below the liquid crystal display panel 120 may be shielded if the liquid crystal display panel 120 includes the backlight source. In addition, in order to enable the liquid crystal display panel 120 to display images normally, the organic light-emitting display panel 110 needs to provide the backlight source for the liquid crystal display panel 120. The organic light-emitting display panel 110 generally includes a metal layer serving as a metal cathode, the inventor proposes that the metal layer in the organic light-emitting display panel 110 is used as the backlight source of the liquid crystal display panel 120. Through the above ingenious design, time-sharing display of double display panels can be realized.

Optionally, the organic light-emitting display panel 110 and the liquid crystal display panel 120 can be combined through a bonding procedure to form the display apparatus.

Figure 2:
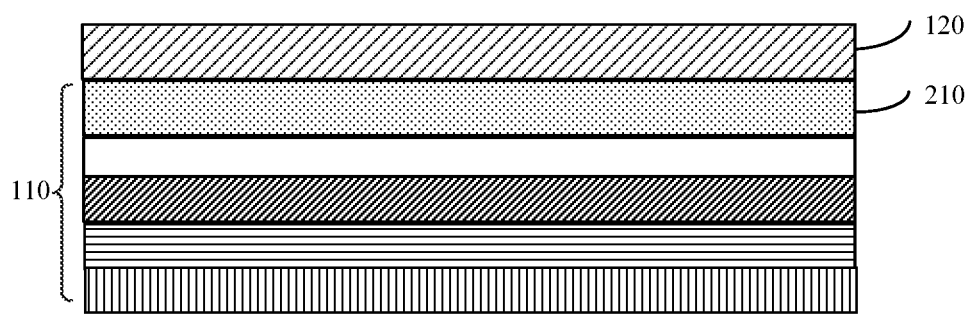
FIG. 2 is a structural schematic diagram illustrating another display apparatus provided in the embodiment 1 of the present disclosure.

Optionally, FIG. 2 shows the structure of the display apparatus provided in the present embodiment. The liquid crystal display panel 120 is close to a metal layer 210 of the organic light-emitting display panel 110 so as to directly use the metal layer 210 as a backlight source for the liquid crystal display panel 120. In an embodiment, the liquid crystal display panel 120 is attached to the metal layer 210 of the organic light-emitting display panel 110 so as to directly use the metal layer 210 as a backlight source of the liquid crystal display panel 120. Ambient light irradiates the metal layer 210 and is reflected by the metal layer 210. The ambient light reflected by the metal layer 210 provides a light source for the liquid crystal display panel 120.

Figure 3:
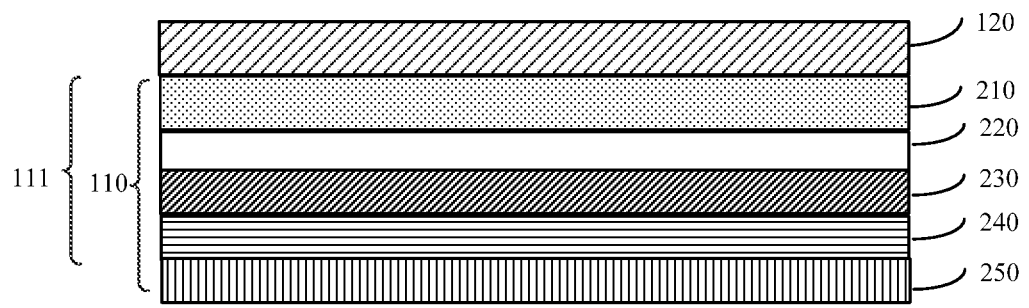
FIG. 3 is a structural schematic diagram illustrating another display apparatus provided in the embodiment 1 of the present disclosure.

In an embodiment, FIG. 3 shows a structure of a display apparatus provided in the present embodiment. The organic light-emitting display panel 110 includes: a first substrate 250, and organic light-emitting structures 111 at one side of the first substrate 250 and arranged in an array. The organic light-emitting structures 111 each include: a hole transporting layer 240, an organic light-emitting layer 230, an electron transporting layer 220 and the metal layer 210 which are stacked successively.

The organic light-emitting structures include red organic light-emitting structures, green organic light-emitting structures, and blue organic light-emitting structures. The red organic light-emitting structure is configured to emit red light, the green organic light-emitting structure is configured to emit green light, and the blue organic light-emitting structure is configured to emit blue light.

Optionally, since the red organic light-emitting structure, the green organic light-emitting structure and the blue organic light-emitting structure have different brightness after turned on, and different turning-on types (only one or two organic light-emitting structures are turned on, or all the organic light-emitting structures are turned on), the organic light-emitting structures can present multiple colors. The light-emitting of the organic light-emitting structures belongs to the charge-injection type light-emitting. In short, electrons injected from a cathode and holes injected from an anode interact at a light-emitting layer to form excited excitons; and when the excitons are back to a ground state from an excited state, the energy difference between the excited state and the ground state is released in the form of photons.

Optionally, the organic light-emitting display panel 110 may be an active-matrix organic light-emitting diode panel (AMOLED).

A foundation of the AMOLED is organic light-emitting cells. Thousands of cells that each can only emit one of red, green and blue are placed on a substrate of the panel in a specific form. When voltages are applied to the light-emitting cells, the light-emitting cells emit red, green or blue. The voltage applying also needs to depend on a thin film transistor (TFT). After a ratio of the three primary colors is regulated, multiple colors can be presented.

OLED, also called an organic electroluminescence device, essentially includes an anode, a cathode and a light-emitting layer that correspond to each pixel region. When a voltage is applied to the anode and the cathode, the holes move to the light-emitting layer through the hole transporting layer; electrons move to the light-emitting layer through the electron transporting layer; the holes and the electrons are recombined in the light-emitting layer; and excitons in light-emitting layer material migrate from the excited state to the ground state, such that light is emitted. The light-emitting layers of the organic light-emitting structures emitting different color lights are made from different materials. The materials of light-emitting layers corresponding to the organic light-emitting structures emitting different color lights respectively emit different color lights under the effects of anode voltages and cathode voltages of the organic light-emitting structures.

Multiple mature AMOLED products have appeared in a relevant technology. In these products, in order to filter out unwanted light waves and increase the display contrast of the AMOLED, a circular polarizer is generally bonded to an upper part of the metal layer in the AMOLED. Therefore, to reduce implementation procedures of the present embodiment and save development cost, in the present embodiment, the circular polarizer in the existing AMOLED products can be omitted, such that the existing AMOLED product with the circular polarizer being removed can be directly used as the organic light-emitting display panel 110 in the present embodiment.

Optionally, this need may be proposed directly at the time of purchasing AMOLED panels from the manufacturers, so that the manufacturers reduce a procedure of bonding the circular polarizer in a production process, and the AMOLED panels without the circular polarizer is directly obtained, i.e., the organic light-emitting display panel 110 is obtained. In the present embodiment, the organic light-emitting display panel 110 formed by the AMOLED can display colorful images, while the liquid crystal display panel 120 can display black-white display images. For example, if a user only needs to display time and date, the time and the date can be displayed through the liquid crystal display panel 120. If the user needs to display Wechat, Wechat can be displayed through the organic light-emitting display panel 110.

The inventor finds through experiments that, the organic light-emitting display panel 110 has an operating current of 100 uA and an operating voltage of 3V, and the liquid crystal display panel 120 has an operating current of 20 mA and an operating voltage of 3V. Using the liquid crystal display panel 120 to display contents which do not need color display, the power consumption can be reduced and electric quantity can be saved to a largest degree. For example, with respect to some intelligent terminals with small battery capacity and short endurance time (e.g., intelligent watches or intelligent bracelets), introduction of the above display apparatus can play a larger effect.

Generally, cost of the liquid crystal display panel 120 is low. In the solution of the present embodiment, through the introduction of the liquid crystal display panel 120, the power consumption of the configured device can be greatly reduced without obvious increasing of the production cost, and the user experience and product competitiveness can be obviously improved.

Figure 4:
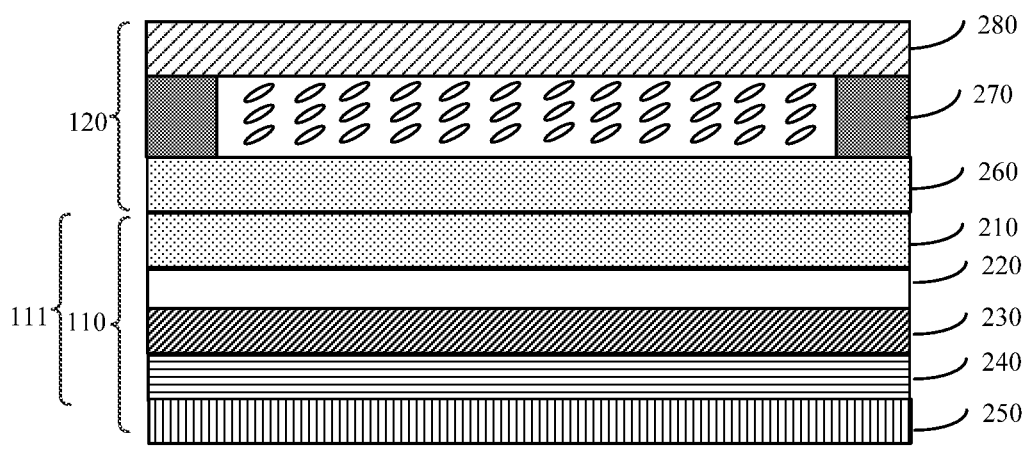
FIG. 4 is a structural schematic diagram illustrating another display apparatus provided in the embodiment 1 of the present disclosure.

FIG. 4 is a structural schematic diagram illustrating a display apparatus provided in the present embodiment. The liquid crystal display panel 120 includes: a second substrate 260, a liquid crystal layer 270 and a third substrate 280 which are stacked successively, The second substrate 260 is attached to the metal layer 210 of the organic light-emitting display panel 110, and the second substrate 260 and the third substrate 280 are transparent materials.

Through above arrangement, the liquid crystal display panel 120 is a transparent panel as a whole. Therefore, when the organic light-emitting display panel 110 below the liquid crystal display panel 120 is operating, the liquid crystal display panel 120 has a smallest influence on the organic light-emitting display panel 110. Although display contrast and color saturation of the organic light-emitting display panel 110 may be sacrificed to a certain degree, the above sacrifice can be compensated in a software mode.

The liquid crystal display panel 120 may be a film compensation super twisted nematic (FSTN) display panel.

A compensation film is generally arranged outside the liquid crystal display panel. The compensation film is generally made of a polymer, and also has birefringence. When o light and e light pass through the compensation film, an additional phase difference may be generated to delay or compensate phases of o light and e light, thereby changing interference colors of polarized light. The compensation film in the FSTN can be located below a polarizer or located above the polarizer. The number of the compensation films may be one or two. For the case where two compensation films are used, the lower one of the two compensation films also plays a role of a collimator, and the lower one of the two compensation films also plays a role of a scattering film, such that the viewing angle of the liquid crystal display is increased without affecting response speed of the liquid crystal display.

In term of the contrast and the viewing angle, the FSTN is a film compensated super twisted nematic (STN), and can display black-white images. FSTN has strict requirements for delay and direction of a polymer film. Compared with yellow-green mode STN, yellow-green mode FSTN has better viewing angle characteristics and better contrast, and a contour line with contrast greater than 5 includes much wider regions. A region with contrast greater than 10 is also larger than that of yellow-green mode STN.

Figure 5:
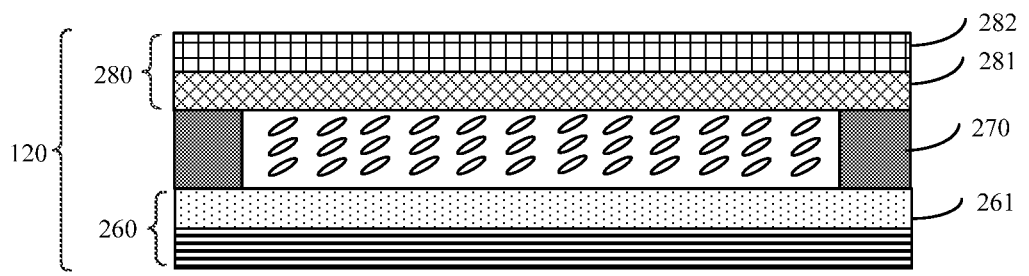
FIG. 5 is a structural schematic diagram illustrating a liquid crystal display panel provided in the embodiment 1 of the present disclosure.

FIG. 5 is a structural schematic diagram illustrating a liquid crystal display panel provided in the present embodiment. The second substrate 260 includes a lower polarizer 261, and the third substrate 280 includes an upper polarizer 281 and a compensation film 282 located at one side of the upper polarizer facing away from the lower polarizer. The compensation film 282 is configured to improve color shift and realize black-white display. The liquid crystal display panel 120 is configured to display the currently presented contents in black-white display. The compensation film has birefringence.

A basic structure of the polarizer includes: a polyvinyl alcohol (PVA) layer at the middle position, two layers of triacetyl cellulose (TAC), a pressure sensitive adhesive (PSA) layer, a film, a release film and a protective film. The PVA layer plays a role of polarization, but PVA is very easy to hydrolyze. To protect physical characteristics of the polarizer, each of the two sides of the PVA layer is provided with a film (such as TAC) with high light transmissivity, good water resistance and certain mechanical strength. In this way, the primary polarizer is formed. In production of the polarizer of the common TN LCD, a PSA layer with certain thickness needs to be formed at one side of the primary polarizer and an isolating film for protecting the PSA film is further provided according to different use requirements. The protective film, a reflecting film and a transflective adhesive film are respectively formed at the other side according to product types, such that a polarizer product is formed. For the polarizer of the STN type LCD, a protective film and a phase difference film with a specific phase difference compensation value are formed at one side of the PSA layer according to specific compensation angles and different needs of customers, thereby forming the polarizer of the STN LCD.

Figure 6:
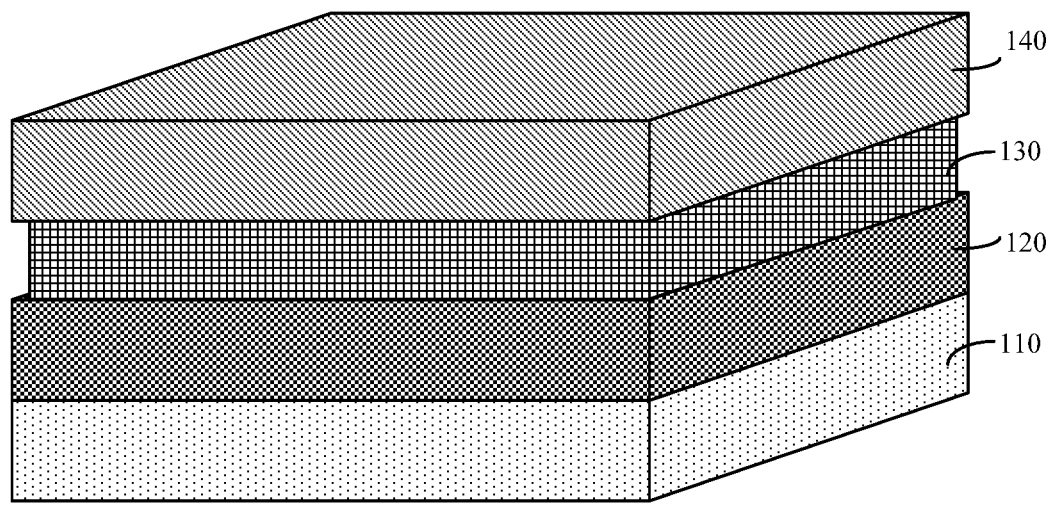
FIG. 6 is a structural schematic diagram illustrating another display apparatus provided in the embodiment 1 of the present disclosure.

FIG. 6 is a structural schematic diagram illustrating a display apparatus provided in the present embodiment. The display apparatus includes an organic light-emitting display panel 110, a liquid crystal display panel 120, a touch functional layer 130 and a protecting cover plate 140. The touch functional layer 130 is located at one side of the liquid crystal display panel 120 facing away from the organic light-emitting display panel 110, and is configured to detect a touch position. The protecting cover plate 140 is located at one side of the touch control functional layer 130 facing away from the liquid crystal display panel 120.

Optionally, the display apparatus also includes a first substrate 250, and organic light-emitting structures 111 arranged at one side of the first substrate 250 and arranged in an array. The organic light-emitting structures 111 include a metal layer 210. In a direction in which the organic light-emitting structures 111 is away from the first substrate 250, the display apparatus also includes a second substrate 260, a liquid crystal layer 270 and a third substrate 280 which are stacked successively. The first substrate 250 and the organic light-emitting structures 111 form an organic light-emitting display panel 110. The second substrate 260, the liquid crystal layer 270 and the third substrate 280 form the liquid crystal display panel 120. The second substrate 260 and the third substrate 280 are made from transparent materials.

Figure 7:
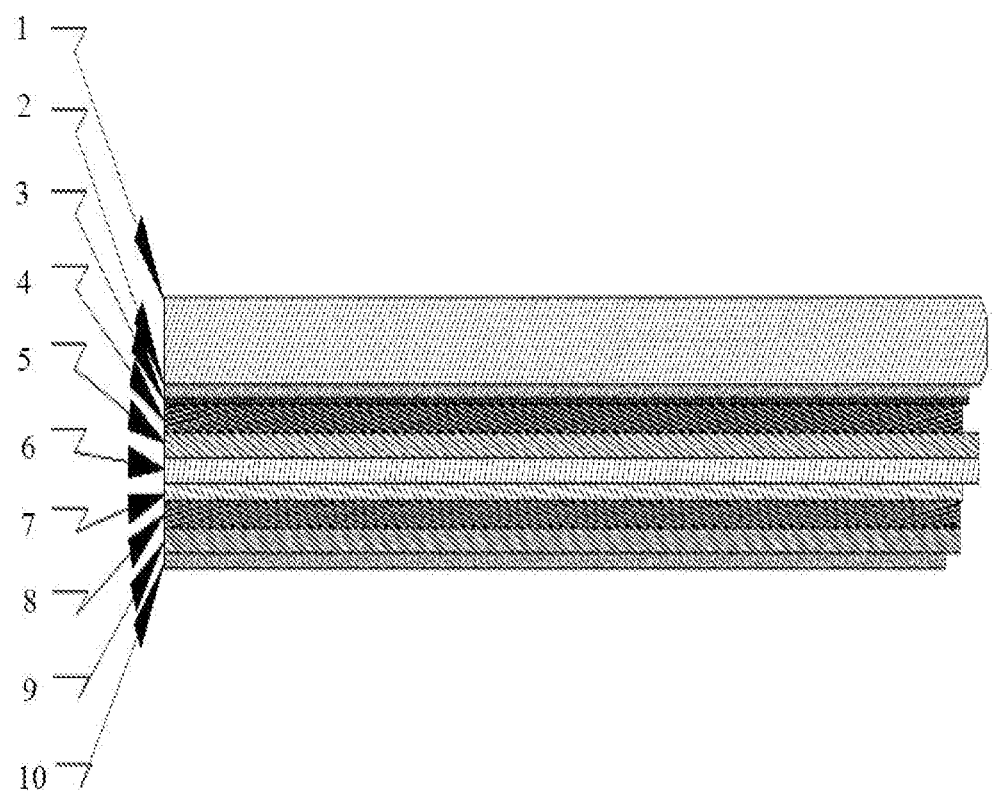
FIG. 7 is a structural schematic diagram illustrating layers of a display apparatus provided in the embodiment 1 of the present disclosure.
Figure 8:
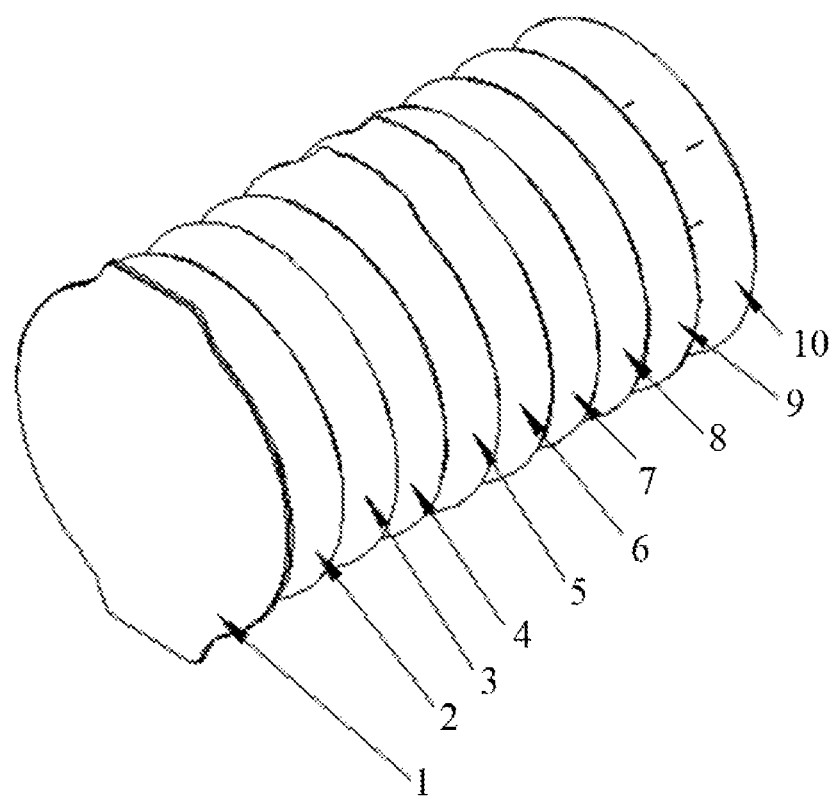
FIG. 8 is an exploded view illustrating a display apparatus provided in the embodiment 1 of the present disclosure.

In practical application, FIG. 7 is a schematic diagram illustrating layers of a display apparatus provided in the present embodiment 1. FIG. 8 is an exploded view illustrating a display apparatus provided in the present embodiment 1. The display apparatus includes a cover plate 1, a transparent adhesive 2, a touch-sensitive sheet 3, an upper polarizer 4 for TN panel, an upper glass 5 for TN panel, a lower glass 6 for TN panel, a lower polarizer 7 for TN panel, an upper glass 8 for OLED panel, a lower glass 9 for OLED panel, and an OLED buffer foam 10 which are stacked successively.

In practical application, the liquid crystal display panel 120 needs a backlight source for display. A common backlight source adopts a full-reflecting lower polarizer, a semi-reflecting semi-transmitting lower polarizer or a backlight module including LEDs. Since the material of the backlight module may be non-transparent plastic material, the organic light-emitting display panel 110 below the liquid crystal display panel 120 is shielded, and the user cannot see the contents displayed on the liquid crystal display panel 120. Therefore, in the present embodiment, the metal layer 210 in the organic light-emitting display panel 110 is used as the backlight source of the liquid crystal display panel 120, namely, ambient lights reflected by the metal layer 210 serve as a light source for the liquid crystal display panel 120.

Optionally, a polarizer needs to be attached to the metal layer 210 of an ordinary AMOLED. Unwanted lights are filtered out through the polarizer, thereby increasing the display contrast. The polarizer is not provided for the AMOLED in the present embodiment, and the metal layer 210 is used as the backlight source of the liquid crystal display panel 120 through the direct attachment of the metal layer 210 and the liquid crystal display panel 120. The metal layer 210 is used as the backlight source of the liquid crystal display panel 120, thereby providing a backlight source for the liquid crystal display panel 120 and improving the display brightness of the organic light-emitting display panel 110. The decrease of the display contrast (black is not black enough) and the color saturation of the organic light-emitting display panel 110 caused by lack of the polarizer attached to the metal layer 210 can be compensated through software regulation.

The present embodiment does not limit the positions of the compensation film 282 and the upper polarizer 281. For example, the compensation film 282 can be arranged at one side of the upper polarizer facing away from the lower polarizer, and can also be arranged at one side of the upper polarizer facing the lower polarizer. The number of compensation films 282 may be one or more, which is not limited in embodiments of the present invention.

In the present embodiment, the polarizer attached to the metal layer 210 of an ordinary organic light-emitting display panel 110 is removed, thereby increasing brightness of the organic light-emitting display panel 110. Meanwhile, the liquid crystal display panel 120 is stacked on the organic light-emitting display panel 110, and the metal layer 210 in the organic light-emitting display panel 110 is used as the backlight source of the liquid crystal display panel 120, thereby realizing time-sharing display in different application scenarios on a premise that the organic light-emitting display panel 110 and the liquid crystal display panel 120 which are of different types and arranged at different layers are not affected by each other.

Embodiment 2

Figure 9:
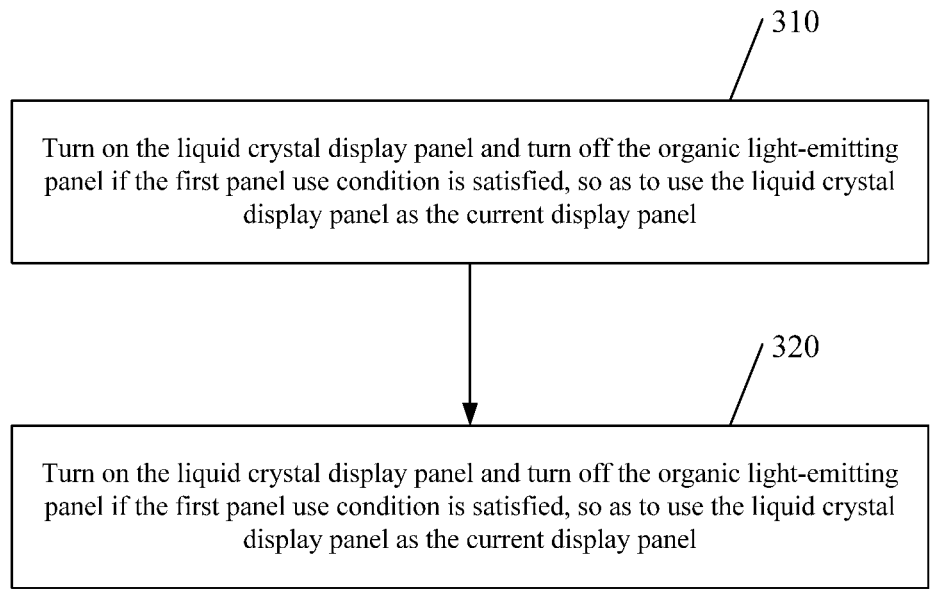
FIG. 9 is a flow chart of a panel switching method provided in the embodiment 2 of the present disclosure.

FIG. 9 is a flow chart of a panel switching method provided in the present embodiment 2. The method is used to conduct switching control over any of the display apparatuses provided in the present embodiment. The method is executed by a panel switching system. The system is implemented by at least one of software and hardware, and can be generally integrated in various electronic devices (e.g., intelligent watches or intelligent mobile phones) having the display apparatus. The method includes: step 310 and step 320.

In the step 310, when a first panel use condition is satisfied, the liquid crystal display panel is turned on and the organic light-emitting panel is turned off so as to use the liquid crystal display panel as a current display panel.

In the step 320, when a second panel use condition is satisfied, the organic light-emitting panel is turned on and the liquid crystal display panel is turned off so as to use the organic light-emitting panel as a current display panel.

The panel switching method in the present embodiment can be applied to the display apparatus provided in the present embodiment. The display apparatus may be a double-panel screen composed of the liquid crystal display panel and the organic light-emitting panel. The double-panel screen can be applied to the intelligent terminal, specifically can be applied to intelligent watches or intelligent bracelets or other intelligent wearable devices, can also be applied to tablet personal computers or mobile phones or other mobile terminals, and can also be applied to other terminals with display need. Generally, many devices adopt an organic display panel as a display screen. An organic light-emitting diode is widely applied to the intelligent terminals for a light weight and a good effect of displaying color images. For example, for the wearable devices, OLED display screen is a better choice. However, if only OLED is adopted as the display screen, a problem may exist, i.e., system power consumption is increased. In a use process of the intelligent terminals, only a small quantity of information needs to be displayed in some application scenarios. Exemplarily, when the user wears a wearable device to participate in outdoor activities. it is possible that only time, dates or step number and other related contents need to be displayed and other information does not need to be displayed. If the OLED is continuously operating for display, unnecessary power consumption is generated. If the wearable device cannot be charged timely, the use of the wearable device by the user may be affected. In view of this problem, the present embodiment adopts a double-panel screen composed of the liquid crystal display panel and the organic light-emitting panel. A TN LCD panel is arranged on the OLED panel. The TN LCD panel is a most widely used entry-level liquid crystal panel with low cost, and is widely used in mainstream medium-end and low-end liquid crystal displays on the market. An improved type including TN+film (film is a compensation film) is used to compensate a defect of a viewing angle of the TN panel. In the related art, the improved TN panel has a viewing angle of 160°, which is certainly a limit value measured by the manufacturer in a case that the contrast is 10:1. Actually, when the contrast is decreased to 100:1, the image has been distorted and even generated color shift. Since the cost of the TN display panel is low, the double-panel screen has high cost performance. Optionally, the FSTN display panel (i.e., the FSTN liquid crystal screen) and the AMOLED (i.e., the AMOLED screen) can be adopted. The AMOLED has self-illumination property, certain flexibility, wide color gamut and thinness, and has special advantages when applied to the wearable device.

The user can choose the display panel for display according to own needs, and the system can also switch the display panel according to actual situations. If the first panel use condition is satisfied, the liquid crystal display panel is turned on and the organic light-emitting panel is turned off so as to use the liquid crystal display panel as a current display panel. If the second panel use condition is satisfied, the organic light-emitting panel is turned on and the liquid crystal display panel is turned off so as to use the organic light-emitting panel as a current display panel.

The intelligent terminal can judge whether the first panel use condition or the second panel use condition is satisfied. The above two steps have no sequential relationship, and an execution order of the two steps is not limited herein. When the first panel use condition is satisfied, it indicates that the use need of the first panel is present. Since the power consumption can be reduced by using the liquid crystal display panel for display, the liquid crystal display panel can be selected when it is not needed to display too many contents. Optionally, the first panel use condition includes any of the following conditions: detecting that a user-inputted operation instruction chooses to use a first panel, detecting that an intelligent terminal is in a moving mode or charging mode, detecting that a light intensity is not lower than a preset intensity threshold and detecting that a length of a time period in which the intelligent terminal is in a standby state is greater than a preset time threshold. The second panel use condition includes any of the following conditions: detecting that the user-inputted operation instruction chooses to use a second panel and detecting that complexity of a user triggered event is greater than a preset complexity threshold. The user-inputted operation may be a user-inputted spatial gesture (e.g., lifting a wrist or rocking an arm), and different definitions can be made for different times of spatial gesture. For example, if the user rocks the arm for one time, it indicates that the user wants to choose the liquid crystal display panel as the display screen, and if the user rocks the arm two times continuously, it indicates that the user wants to choose the organic display panel as the display screen. The user can also input instructions through mechanical buttons on the intelligent terminal. Exemplarily, the user can input the instructions through a crown of the intelligent watch, and can also switch the screen according to a mode of the intelligent terminal. For example, when the intelligent terminal is in the moving mode or the charging mode, the user has no need of viewing application software and the like and can switch to the liquid crystal display panel for display. The intelligent terminal may be provided with a near field communication (NFC) chip, and can be used to replace a metro card, a bus card or a bank card and the like. When the intelligent terminal is used to swipe card rapidly, the intelligent terminal only needs to be close to a card reader or a turnstile. If the user has no viewing need, the user can choose the liquid crystal display panel for display.

After the intelligent terminal is in a standby state for a specific time, it can also be determined that the user has no need of conducting complex operation on the intelligent terminal at present, and the liquid crystal display panel can be selected to achieve an energy saving effect. In addition, the TN display panel has the following characteristics: as the light intensity is increased, the display contrast of a picture is also increased. Namely, in the black-white display mode, the displayed picture is more clear. However, when the intensity of ambient light of the OLED screen is high, the brightness of the screen shall be adjusted to a large value, thereby generating a high power consumption. Therefore, when the light intensity is high, the TN panel is used for display images. The first panel use condition may be that the light intensity is greater than a preset light intensity threshold. The preset light intensity threshold can be adjusted according to the property of the display panel, and can also be set according to actual needs. The second panel use condition may be that the complexity of the user triggered event is greater than a preset complexity threshold. The complexities of all user triggered events that may be generated can be assessed in advance. The complexities are determined according to the complexities of pictures to be displayed. The user triggered events may be viewing time, listening to music or radio, starting an application program and the like. The events of "viewing time", "viewing weather" and the like can be defined as events with low complexity; and the event of "starting an application program" can be defined as an event with high complexity. When the complexity of the event exceeds the preset complexity threshold, it indicates that the event has a high display need. For example, when the user uses the intelligent terminal to start an application program of Alipay for making payment or the user chats through Wechat, it is needed to use the OLED panel for displaying images.

In the panel switching method provided in the present embodiment, two display panels in the double-panel screen are switched according to different conditions, thereby ensuring actual display needs and achieving effects of saving energy and reducing power consumption. The display panels can also be selected according to user willing, thereby promoting user experience, enabling the product to be closer to the actual needs of the user and facilitating product popularization.

Embodiment 3

Figure 10:
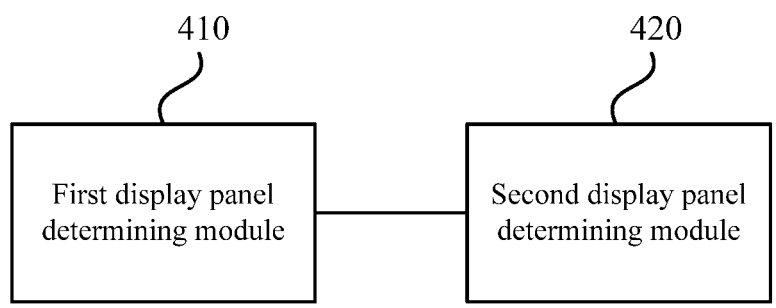
FIG. 10 is a structural schematic diagram of a panel switching system provided in the embodiment 3 of the present disclosure.

FIG. 10 is a structural schematic diagram illustrating a panel switching system provided in the present embodiment. The system can be realized by at least one of software and hardware, and can execute the panel switching method provided in any embodiment. The system includes:

a first display screen determining module 410 configured to turn on the liquid crystal display panel and turn off the organic light-emitting panel if the first panel use condition is satisfied, so as to use the liquid crystal display panel as a current display panel; and a second display screen determining module 420 configured to turn on the organic light-emitting panel and turn off the liquid crystal display panel if the second panel use condition is satisfied, so as to use the organic light-emitting panel as a current display panel.

Optionally, the first panel use condition includes any of the following conditions:

detecting that a user-inputted operation instruction chooses to use a first panel, detecting that an intelligent terminal is in a moving mode or charging mode, detecting that the light intensity is not lower than a preset intensity threshold and detecting that the intelligent terminal is at the standby state for a time period greater than a preset time threshold.

The second panel use condition includes any of the following conditions:

detecting that the user-inputted operation instruction chooses to use a second panel and detecting that complexity of a user triggered event is greater than the preset complexity threshold.

The above panel switching system can execute the panel switching method provided by any embodiment, and has a functional module for executing the panel switching method and beneficial effects.

Embodiment 4

Figure 11:
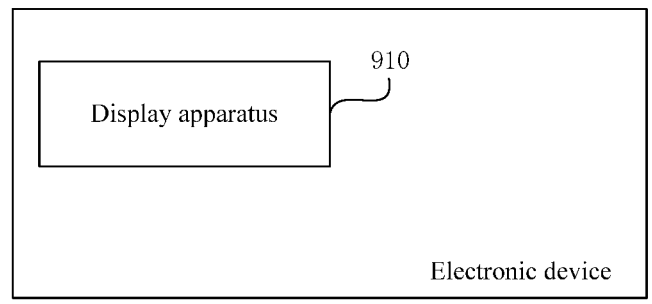
FIG. 11 is a structural schematic diagram of an electronic device provided in the embodiment 4 of the present disclosure.

FIG. 11 is a structural diagram illustrating an electronic device provided in the present embodiment 4. As shown in FIG. 11, the electronic device includes the display apparatus 910 in any embodiment.

Embodiment 5

Figure 12:
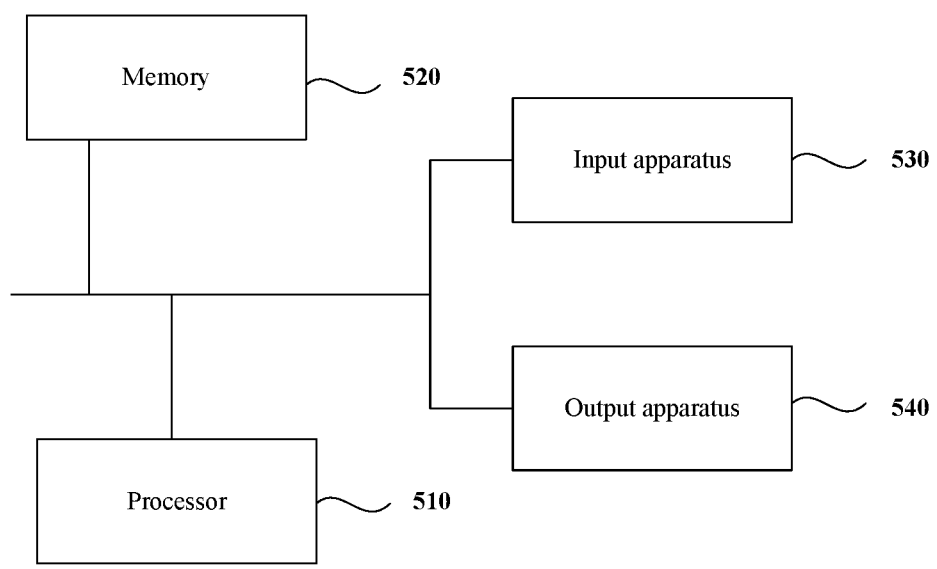
FIG. 12 is a schematic diagram illustrating the hardware configuration of an electronic device provided in the embodiment 5 of the present disclosure.

FIG. 12 is a schematic diagram illustrating the hardware configuration of a device provided in the present embodiment 5. As shown in FIG. 12, the device includes:

one or more processors 510, where one processor 510 is taken as an example in FIG. 12, and a memory 520.

The device can also include: an input apparatus 530 and an output apparatus 540.

The processor 510, the memory 520, the input apparatus 530 and the output apparatus 540 in the device can be connected by a bus or in other manners, and connecting by the bus is taken as an example in FIG. 12.

As a non-transitory computer readable storage medium, the memory 520 may be used for storing software programs, computer executable programs and modules, such as program instructions/modules (e.g., the first display screen determining module 410 and the second display screen determining module 420 shown in FIG. 10) corresponding to the panel switching method in embodiments of the present application. The processor 510 executes various kinds of function application and data processing of the panel switching system by operating the software programs, the instructions and the modules stored in the memory 520, thereby realizing the panel switching method in above method embodiments.

The memory 520 may include a program storage region and a data storage region. The program storage region can store an operating system and application programs required for at least one function; and the data storage region may store data and the like created according to use of the electronic device. In addition, the memory 520 may include a high-speed random access memory, and may also include a non-transitory memory, such as at least one disk memory device, a flash memory device or other non-transitory solid-state memory devices. In some embodiments, the memory 520 may include memories remotely arranged relative to the processor 510, where these remote memories may be connected to the terminal device by a network. An example of the above network includes but not limited to Internet, Intranet, local area network, mobile communication network and a combination thereof.

The input apparatus 530 may be used for receiving input digit or character information, and producing key signal input related to user setting and function control of the electronic device. The output apparatus 540 may include a display screen and other display devices.

Embodiment 6

The present embodiment 6 provides a computer readable storage medium which is used for storing a computer program The program realizes the panel switching method provided by all embodiments of the present application when executed by the processor. The method includes:

if the first panel use condition is satisfied, the liquid crystal display panel is turned on and the organic light-emitting panel is turned off so as to use the liquid crystal display panel as a current display panel; and if the second panel use condition is satisfied, the organic light-emitting panel is turned on and the liquid crystal display panel is turned off so as to use the organic light-emitting panel as a current display panel.

One computer readable medium or any combination of multiple computer readable media can be adopted. The computer readable medium may be a computer readable signal medium or a computer readable storage medium. The computer readable storage medium, for example, may be but not limited to electrical, magnetic, optical, electromagnetic, infrared or semiconductor system, apparatus or device or any combination thereof. More specific examples (non-exhaustive list) of the computer readable storage medium include: electrical connection by one or more wires, a portable computer disk, a hard disk, a random access memory (RAM), a read-only memory (ROM), an electrically programmable read-only-memory (EPROM or flash memory), an optical fiber, a compact disc read-only memory (CD-ROM), an optical storage device, a magnetic storage device or any proper combination thereof. In the present invention, the computer readable storage medium may be any tangible medium that includes or stores programs. The programs can be used by or combined with an instruction executing system, apparatus or device for use.

The computer readable signal medium may include a data signal which is transmitted in a base band or transmitted as part of a carrier wave, and the computer readable signal medium carries computer readable program codes. The transmitted data signal may be in many forms, including but not limited to an electromagnetic signal, an optical signal or any proper combination thereof. The computer readable signal medium may also be any computer readable medium other than the computer readable storage medium. The computer readable medium may send, transmit, or transfer programs used by or combined with the instruction executing system, apparatus or device for use.

The program codes included on the computer readable medium can be transmitted with any proper medium, including but not limited to a wireless medium, a wire, a cable, an RF and the like or any proper combination thereof.

The computer program codes used to perform this operation can be written in one or more programming languages or combinations thereof. The programming languages include object-oriented programming languages (such as Java, Smalltalk and C++), and also include conventional procedural programming languages (such as "C" language or similar programming languages). The program codes can be fully executed on a user computer, partially executed on the user computer, executed as an independent software package, partially executed on the user computer and partially executed on a remote computer, or fully executed on the remote computer or a server. If the remote computer is involved, the remote computer can be connected to the user computer through any kind of network including LAN or WAN, or can be connected to an external computer (e.g., connected through Internet using an Internet service provider).

It should be noted that the above only describes optional embodiments and applied technical principles of the present disclosure. It shall be understood by those skilled in the art that, the present disclosure is not limited to specific embodiments described herein. Those skilled in the art can make various apparent changes, readjustments and replacements without departing from a protection scope of the present disclosure. Therefore, although the present disclosure is described in detail through above embodiments, the present disclosure is not limited to above embodiments and may further include more other equivalent embodiments without departing from concepts of the present disclosure, while the scope of the present disclosure is decided by a scope of attached claims.

INDUSTRIAL APPLICABILITY

The present disclosure can realize time-sharing display under different application scenarios on a premise that two display panels which are of different types and are vertically stacked are not affected by each other.

What is claimed is:

1. A display apparatus, comprising: an organic light-emitting display panel and a liquid crystal display panel disposed on a light-emitting side of the organic light-emitting display panel,
   wherein the organic light-emitting display panel comprises a reflective metal layer, the liquid crystal display panel is attached to the reflective a metal layer so as to use the reflective metal layer as a backlight source of the liquid crystal display panel, and
   wherein the liquid crystal display panel is configured to be on in a case where a first panel use condition is satisfied and to be off in a case where a second panel use condition is satisfied, and the organic light-emitting panel is configured to be off when the first panel use condition is satisfied and to be on when the second panel use condition is satisfied, so that in the case where the first panel use condition is satisfied, the liquid crystal display panel is used as a current display panel, and in the case where the second panel use condition is satisfied, the organic light-emitting panel is used as a current display panel.

2. The display apparatus according to claim 1, wherein the organic light-emitting display panel comprises:
   a first substrate; and
   organic light-emitting structures at one side of the first substrate and arranged in an array,
   wherein each of the organic light-emitting structures comprises: a hole transporting layer, an organic light-emitting layer, an electron transporting layer and the reflective metal layer which are arranged successively.

3. The display apparatus according to claim 2, wherein the organic light-emitting structures comprise a red organic light-emitting structure, a green organic light-emitting structure and a blue organic light-emitting structure; the red organic light-emitting structure is configured to emit red light; the green organic light-emitting structure is configured to emit green light; and the blue organic light-emitting structure is configured to emit blue light.

4. The display apparatus according to claim 2, wherein the liquid crystal display panel comprises: a second substrate, a liquid crystal layer and a third substrate which are arranged successively,
   wherein the second substrate is attached to the reflective metal layer in the organic light-emitting display panel.

5. The display apparatus according to claim 1, wherein the organic light-emitting display panel is an active-matrix organic light-emitting diode panel.

6. The display apparatus according to claim 5, wherein the liquid crystal display panel comprises: a second substrate, a liquid crystal layer and a third substrate which are arranged successively,
   wherein the second substrate is attached to the reflective metal layer in the organic light-emitting display panel.

7. The display apparatus according to 1, wherein the liquid crystal display panel comprises: a second substrate, a liquid crystal layer and a third substrate which are arranged successively,
   wherein the second substrate is attached to the reflective metal layer in the organic light-emitting display panel.

8. The display apparatus according to claim 7, wherein the second substrate and the third substrate are made from transparent materials.

9. The display apparatus according to claim 8, wherein the second substrate comprises a lower polarizer; the third substrate comprises an upper polarizer and a compensation film located at one side of the upper polarizer facing away from the lower polarizer.

10. The display apparatus according to claim 7, wherein the second substrate comprises a lower polarizer; the third substrate comprises an upper polarizer and a compensation film located at one side of the upper polarizer facing away from the lower polarizer.

11. The display apparatus according to claim 1, wherein the liquid crystal display panel is a film compensation super twisted nematic display panel.

12. A panel switching method, for a switching control of a display apparatus, wherein the display apparatus comprises an organic light-emitting display panel and a liquid crystal display panel disposed on a light-emitting side of the organic light-emitting display panel, wherein the organic light-emitting display panel comprises a reflective metal layer, the liquid crystal display panel is attached to the reflective a metal layer so as to use the reflective metal layer as a backlight source of the liquid crystal display panel, the panel switching method comprising:
   turning on the liquid crystal display panel and turning off the organic light-emitting panel when a first panel use condition is satisfied, so as to use the liquid crystal display panel as a current display panel; and
   turning on the organic light-emitting panel and turning off the liquid crystal display panel when a second panel use condition is satisfied, so as to use the organic light-emitting panel as a current display panel.

13. The method according to claim 12, wherein the first panel use condition comprises any of the following conditions:
- detecting that a user-inputted operation instruction chooses to use a first panel;
- detecting that an intelligent terminal is in a moving mode or charging mode;
- detecting that a light intensity is not lower than a preset intensity threshold; and
- detecting that a length of a time period in which the intelligent terminal is in a standby state is greater than a preset time threshold.

14. The method according to claim 13, wherein the second panel use condition comprises any of the following conditions:
- detecting that an user-inputted operation instruction chooses to use a second panel, and
- detecting that a complexity of a user triggered event is greater than a preset complexity threshold.

15. The method according to claim 12, wherein the second panel use condition comprises any of the following conditions:
- detecting that an user-inputted operation instruction chooses to use a second panel, and
- detecting that a complexity of a user triggered event is greater than a preset complexity threshold.

16. An electronic device, comprising a display apparatus;
wherein the display apparatus comprises: an organic light-emitting display panel and a liquid crystal display panel disposed on a light-emitting side of the organic light-emitting display panel,
wherein the organic light-emitting display panel comprises a reflective metal layer, the liquid crystal display panel is attached to the reflective metal layer so as to use the reflective metal layer as a backlight source of the liquid crystal display panel, and
wherein the liquid crystal display panel is configured to be on in a case where a first panel use condition is satisfied and to be off in a case where a second panel use condition is satisfied, and the organic light-emitting panel is configured to be off when the first panel use condition is satisfied and to be on when the second panel use condition is satisfied, so that in the case where the first panel use condition is satisfied, the liquid crystal display panel is used as a current display panel, and in the case where the second panel use condition is satisfied, the organic light-emitting panel is used as a current display panel.

17. The electronic device according to claim 16, wherein the organic light-emitting display panel comprises:
- a first substrate; and
- organic light-emitting structures at one side of the first substrate and arranged in an array,
wherein each of the organic light-emitting structures comprises: a hole transporting layer, an organic light-emitting layer, an electron transporting layer and the reflective metal layer which are arranged successively.

18. The electronic device according to claim 16, wherein the organic light-emitting display panel is an active-matrix organic light-emitting diode panel.

19. The electronic device according to claim 16, wherein the liquid crystal display panel comprises: a second substrate, a liquid crystal layer and a third substrate which are arranged successively,
wherein the second substrate is attached to the reflective metal layer in the organic light-emitting display panel.

20. The electronic device according to claim 19, wherein the second substrate and the third substrate are made from transparent materials.

* * * * *